US 6,751,015 B2

(12) United States Patent
Goldstein et al.

(10) Patent No.: US 6,751,015 B2
(45) Date of Patent: Jun. 15, 2004

(54) SEMICONDUCTOR OPTICAL AMPLIFIER

(75) Inventors: Léon Goldstein, Chaville (FR); Jean-Yves Emery, Palaiseau (FR)

(73) Assignee: Avanex Corporation, Fremont, CA (US)

( * ) Notice: Subject to any disclaimer, the term of this patent is extended or adjusted under 35 U.S.C. 154(b) by 0 days.

(21) Appl. No.: 10/110,378

(22) PCT Filed: Aug. 20, 2001

(86) PCT No.: PCT/FR01/02632
§ 371 (c)(1),
(2), (4) Date: Apr. 11, 2002

(87) PCT Pub. No.: WO02/17454
PCT Pub. Date: Feb. 28, 2002

(65) Prior Publication Data
US 2002/0154391 A1 Oct. 24, 2002

(30) Foreign Application Priority Data
Aug. 22, 2000 (FR) .............................. 0010818

(51) Int. Cl.⁷ .................................. H01S 3/00
(52) U.S. Cl. ........................................ 359/344
(58) Field of Search ............................ 359/344

(56) References Cited

U.S. PATENT DOCUMENTS

| | | | |
|---|---|---|---|
| 4,952,017 A | * 8/1990 | Henry et al. | 359/344 |
| 5,151,818 A | * 9/1992 | Thijs et al. | 359/344 |
| 6,008,675 A | 12/1999 | Handa | 327/96 |
| 6,175,446 B1 | * 1/2001 | Alphonse | 359/344 |
| 6,310,719 B1 | * 10/2001 | Goldstein et al. | 359/344 |
| 6,487,007 B1 | * 11/2002 | Morito | 359/344 |
| 2001/0043390 A1 | * 11/2001 | Kim et al. | 359/344 |

FOREIGN PATENT DOCUMENTS

| | | | |
|---|---|---|---|
| EP | 0 841 733 A1 | 5/1998 | H01S/3/25 |
| JP | 11-74604 A | 3/1999 | H01S/3/18 |

OTHER PUBLICATIONS

Sigogne De et al.: "1.55 um polarisation insensitive InGaAsP strained MQW optical amplifier integrated with short spot–size converters" Electronics Letters, IEEE Steveange, GB, vol. 32, No. 15, Jul. 19, 1996, pp. 1403–140.
Kelly A E et al.: "Low Noise Figure (7.2DB) and High gain (290DB) Semiconductor Optical Amplifier with a single layer AR coating" Electronics Letters, IEEE Stevenage, GB, vol.. 33, np. Mar. 13, 1997, pp. 536–538, XP000693290.

* cited by examiner

Primary Examiner—Thomas G. Black
Assistant Examiner—Deandra M. Hughes
(74) Attorney, Agent, or Firm—Moser Patterson & Sheridan LLP

(57) ABSTRACT

The invention concerns a semiconductor optical amplifier including at least two amplifier sections (30, 40) respectively favoring a higher gain of the TE mode and the TM mode of polarization of the light to be amplified, said sections each having an active guide structure (12) of the same thickness (e), the amplifier being characterized in that the active guide structure (12) of the two sections (30, 40) is subjected to respective different tension stresses and/or has a different geometry so as to render the overall gain of the amplifier insensitive to the polarization of said light to be amplified, and in that there is no discontinuity of the effective refractive index at the transition between the sections (30, 40).

4 Claims, 2 Drawing Sheets

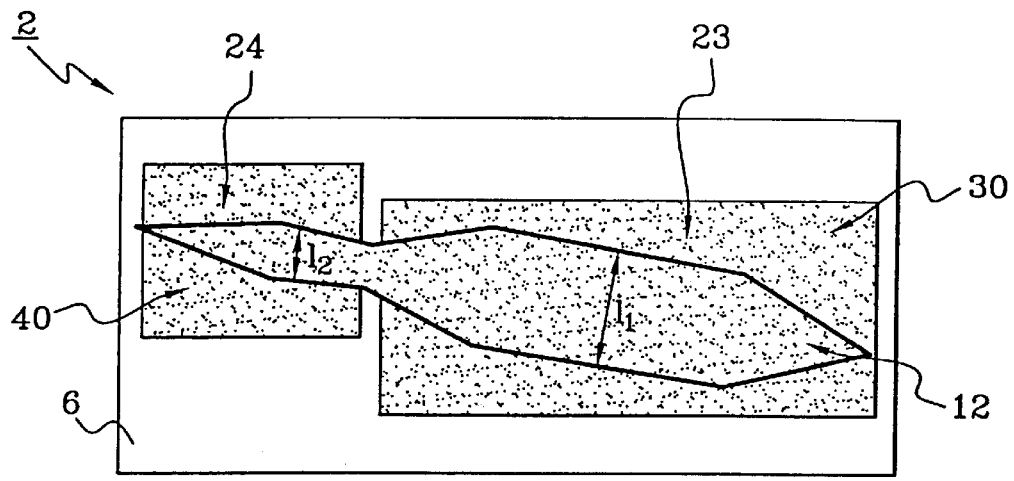
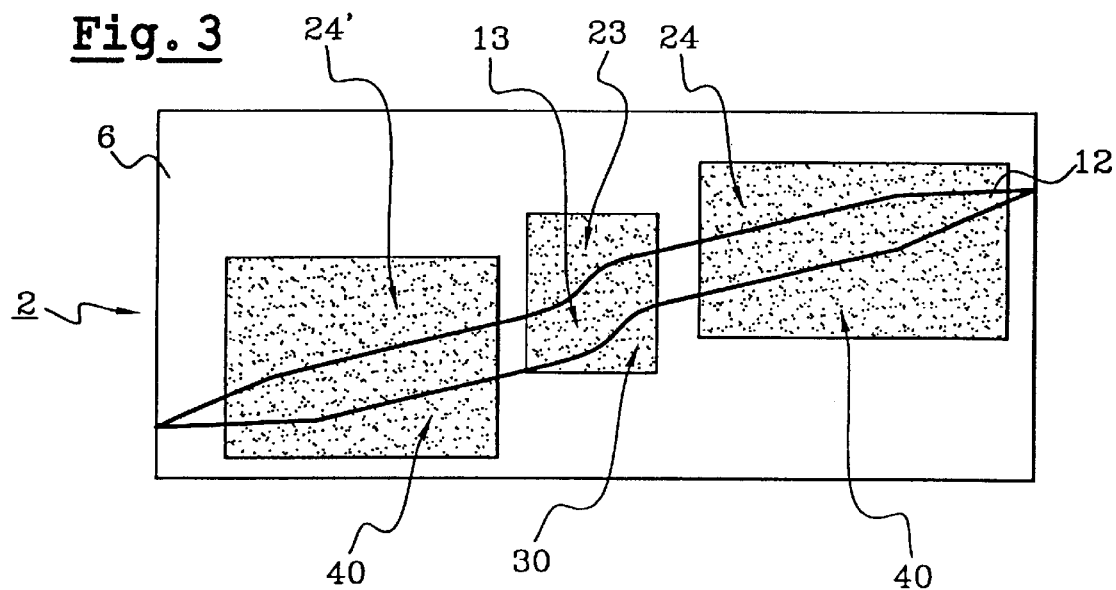
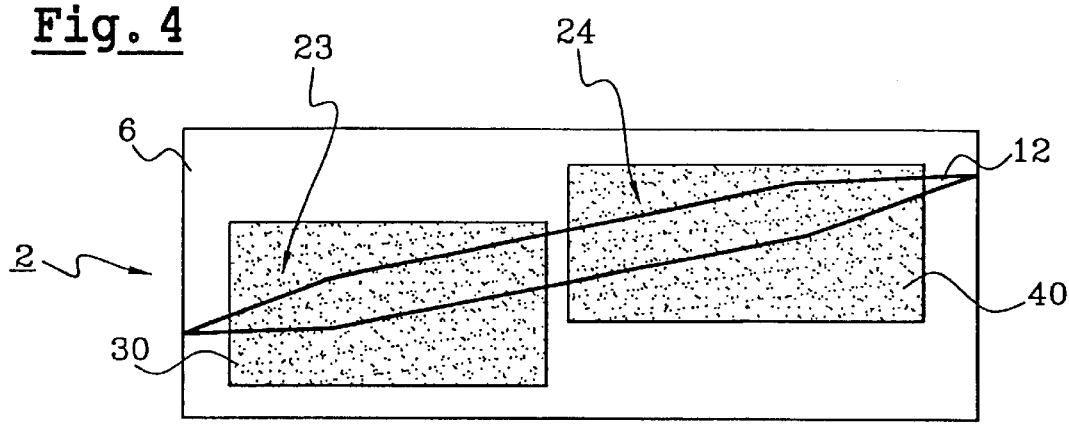

SEMICONDUCTOR OPTICAL AMPLIFIER

The present invention relates to amplifying optical signals. It finds a typical application in fiber optic telecommunication networks. The signals transmitted by fiber optic telecommunication networks consist of pulses carrying information to be transmitted in binary form. The pulses must be amplified to compensate power losses that they suffer during their propagation in said networks. Semiconductor amplifiers constitute a compact means of obtaining such amplification and can be integrated. However, unless specific measures are implemented to prevent it, their gain is sensitive to the state of polarization of the light that they receive, as indicated more simply hereinafter by referring to the polarization-sensitivity of an amplifier.

The invention finds a particular application when it is necessary to eliminate or at least limit polarization-sensitivity, which can be expressed by the following equation: $\Delta G = G_{TE} - G_{TM}$. The aim is to achieve the condition $|\Delta G| < 1$ dB.

The situation in which the sensitivity must be limited or eliminated is frequently encountered and arises when the distance traveled by the optical pulses to be amplified is such that the state of polarization of the pulses has been significantly and randomly affected during their propagation and it is preferable for the amplified pulses to have one or more predetermined power levels.

More generally, the invention finds an application whenever an optical amplifier must have no polarization-sensitivity or a low polarization-sensitivity.

The invention applies more specifically to buried ridge structure (BRS) amplifiers.

A buried ridge structure semiconductor optical amplifier (see FIG. 1) includes a wafer 2 made up of layers of semiconductor materials having respective refractive indices and forming a common crystal lattice. In the absence of mechanical stresses, the lattices formed by these materials have respective characteristic dimensions constituting respective lattice parameters of the materials. The layers are in succession in a vertical direction DV forming a right-angle trihedron, defined with respect to the wafer 2, with two horizontal directions constituting a longitudinal direction DL and a transverse direction DT. The layers form an upward succession in the vertical direction DV from a bottom face 4 to a top face 6. The wafer 2 includes at least the following layers or groups of layers or parts of layers:

A substrate 8 consisting mainly of a semiconductor basic material having a first type of conductivity. This substrate is sufficiently thick to impose the dimensions of the lattice of the basic material on all of the crystal lattice of the wafer 2.

An active layer 10 including an active material adapted to amplify light by stimulated recombination of charge carriers of both types injected into the material.

Finally, a top confinement layer 18 consisting of a material having a second type of conductivity which is the opposite of the first type.

The amplifier further includes a bottom electrode 20 and a top electrode 22 respectively formed on the bottom face 4 and the top face 6 of the wafer 2 to enable an electrical current to flow between said faces for injecting said charge carriers of both types into the active material.

The basic materials of prior art semiconductor optical amplifiers are III–V materials, typically indium phosphide and gallium arsenide. The active material is typically a ternary or quaternary material containing the same chemical elements. It is generally required for the width l of the guide active structure 12 which guides the light to be close to one micrometer, to facilitate etching it and most importantly to facilitate integrating the amplifier with other optical components on the same semiconductor wafer. To ensure monomode propagation of light, typically at a wavelength of 1 310 nm or 1 550 nm, the thickness e must then be very much less than the width l. If no special measures are applied to prevent it, this rectangular shape of the section of the guide active structure 12 causes the polarization-sensitivity previously mentioned.

In BRS amplifiers, the active material 10 constituting the active structure 12 guiding the light is surrounded on all sides by a binary semiconductor material 14, 16. This material has the advantage of conducting heat well, but its refractive index is only slightly lower than that of the active material. Consider further the situation in which the active material is homogeneous, in which case it is referred to as a bulk material. As a general rule, the section of the buried guide active structure 12 is strongly rectangular. Given the small index difference between the guide structure 12 and the surrounding binary material 14, 16, the confinement of a horizontally polarized wave is greater than that of a vertically polarized wave, the difference between the two confinement factors increasing as the ratio of the width l to the thickness e of the guide structure 12 increases. The confinement referred to above in connection with a wave is in a transverse plane. It is equal to the ratio of the power of the wave in the area occupied by the guide structure to the total power of the wave. The confinement factor is defined for each polarization and for each wavelength by the shape and dimensions of the section of the ridge and by the refractive indices of the material of the ridge and the surrounding material. In the case of a rectangular section, it can be considered to be the product of a directional confinement factor in the horizontal direction by a directional confinement factor in the vertical direction, each of the two directional confinement factors depending on the polarization. Given that the phenomenon of amplification of the wave by recombination of carriers and stimulated emission occurs only in the active material, i.e. in the ridge 12, the gain of the amplifier for a wave increases as the confinement of the wave increases. As a result of this, if the material of the guide structure 12 were a homogeneous material, and also isotropic, and therefore insensitive to polarization, the gain of the amplifier would be greater for horizontally polarized waves than for vertically polarized waves.

Considerable research has been conducted into making these amplifiers insensitive to the polarization of the light to be amplified.

In particular, the applicant's U.S. Pat. No. 5,982,531 proposes an amplifier of this kind that is rendered insensitive to the polarization of the light. The amplifier is characterized in that its active material is subjected to a sufficient tension stress to render its gain insensitive to the polarization of said light to be amplified. This stress generally results from a lattice mismatch between the active material and the basic material of the substrate. The horizontal confinement factor is typically equal to the product of the vertical confinement factor by a confinement asymmetry coefficient.

The present patent application is based on the observation that, even in the presence of a high confinement asymmetry coefficient resulting, for example, from the fact that the guide structure 12 consists of a ridge of strongly rectangular section, the tension stress to be applied to a homogeneous active material forming said ridge to obtain insensitivity to polarization is sufficiently low for the thickness of the ridge to remain less than the corresponding critical thickness relating to dislocations.

The above kind of amplifier has a low sensitivity to polarization. Its main parameters are:

the wavelength of the amplifying active layer: $\lambda=1.57\,\mu m$, the active material: $In_{1-x}Ga_xP_{1-y}As_y$, the tension stress of the active layer: $\Delta a/a=-0.015$, the thickness of the active layer: $e=0.2\,\mu m$, and the width of the ridge: $l=1\,\mu m$.

This kind of structure has drawbacks, however. It has been established experimentally and theoretically that the polarization depends strongly on the control of the thickness of the active layer and the stresses to which it is subjected. For example, modifying this stress ($\Delta a/a$) from $-0.015$ to $-0.014$ or $-0.016$ induces a gain shift $\Delta G$ of 0.8 dB toward a respective sensitivity of the TE mode or the TM mode. Similarly, a slight modification of the thickness of the active layer (of a few percent) directly induces a gain offset $\Delta G$ of the amplifier. Accordingly the sensitivity of the amplifier to the polarization of the light depends on its structure and cannot be controlled easily.

The object of the present invention is to remove the drawbacks of the technology proposed by the previously cited U.S. Pat. No. 5,982,531.

To this end, the present invention proposes a structure such that the polarization-sensitivity of the overall gain $\Delta G$ of the amplifier is easily controlled by a current, to provide "active" adjustment of polarization-sensitivity.

The semiconductor optical amplifier according to the invention therefore has at least two separate sections, each provided with an electrode and each having a different geometry and/or tension stress so as respectively to favor a higher gain of the TE mode and the TM mode.

A structure of this kind with two sections has already been disclosed, in particular in Japanese Patent Application JP 10154841, which discusses a solution consisting of varying the thickness of the active layer from one section to the other to influence the gain by respectively favoring the TE mode with a small thickness and then the TM mode with a greater thickness.

To obtain a polarization-independent amplifier the gains of the two sections can be adjusted by varying the current injected into each electrode of each section.

However, the solution proposed in the above Japanese patent application has disadvantages, in particular from the point of view of its technical implementation.

On the one hand, the transition between the two sections is abrupt, which causes a non-adiabatic modification of the sizes of the modes propagating in the active layer, and causes a reflection of the light waves at the transition. Reflections in a SOA are unacceptable.

On the other hand, implementing this kind of structure necessitates a step of etching the active layer, which must be perfectly controlled, followed by a step of further epitaxial growth. Well-controlled etching necessitates dry etching followed by chemical etching. This kind of technique is generally avoided on active materials because it induces surface recombination effects which degrade the quality of the active layer. Also, the further epitaxial growth step is particularly difficult on a thin active layer.

The present invention aims to remove these drawbacks by proposing another structure with two sections enabling "active" adjustment by respectively favoring a higher gain of the TE mode and the TM mode.

The structure proposed by the invention entails producing two sections having an active layer of the same thickness but subjected to different tension stresses and/or having different geometries, whilst at the same time ensuring continuity of the effective refractive index of the active layer in the two sections for a transition that is adiabatic or with no index step.

To be more specific, the present invention consists in a semiconductor optical amplifier including at least two amplifier sections respectively favoring a higher gain of the TE mode and the TM mode of polarization of the light to be amplified, said sections each having an active guide structure of the same thickness, the amplifier being characterized in that the active guide structure of the two sections is subjected to respective different tension stresses and/or has a different geometry so as to render the overall gain of the amplifier insensitive to the polarization of said light to be amplified, and in that there is no discontinuity of the effective refractive index at the transition between the sections.

In a first embodiment the active guide structure has a respective different width in the sections.

In a second embodiment the active guide structure of at least one section has a curved portion.

In a third embodiment the active guide structure of the sections is subjected to respective different tension stresses.

In accordance with one feature of the third embodiment the active guide structure of the sections is made from a material having different stoichiometric ratios between the elements constituting said material.

In accordance with one feature of the invention the material of the active guide structures is a quaternary material.

In accordance with one feature of the invention the quaternary material is InGaAsP.

The features and advantages of the invention will become clearly apparent on reading the following description, which is given by way of non-limiting illustrative example and with reference to the accompanying drawings, in which:

FIG. 1, already described, is a diagram of a prior art buried ridge structure semiconductor optical amplifier;

FIG. 2 is a diagrammatic plan view of a first embodiment of an amplifier according to the invention;

FIG. 3 is a diagrammatic plan view of a second embodiment of an amplifier according to the invention;

FIG. 4 is a diagrammatic plan view of a third embodiment of an amplifier according to the invention.

Figure 1:
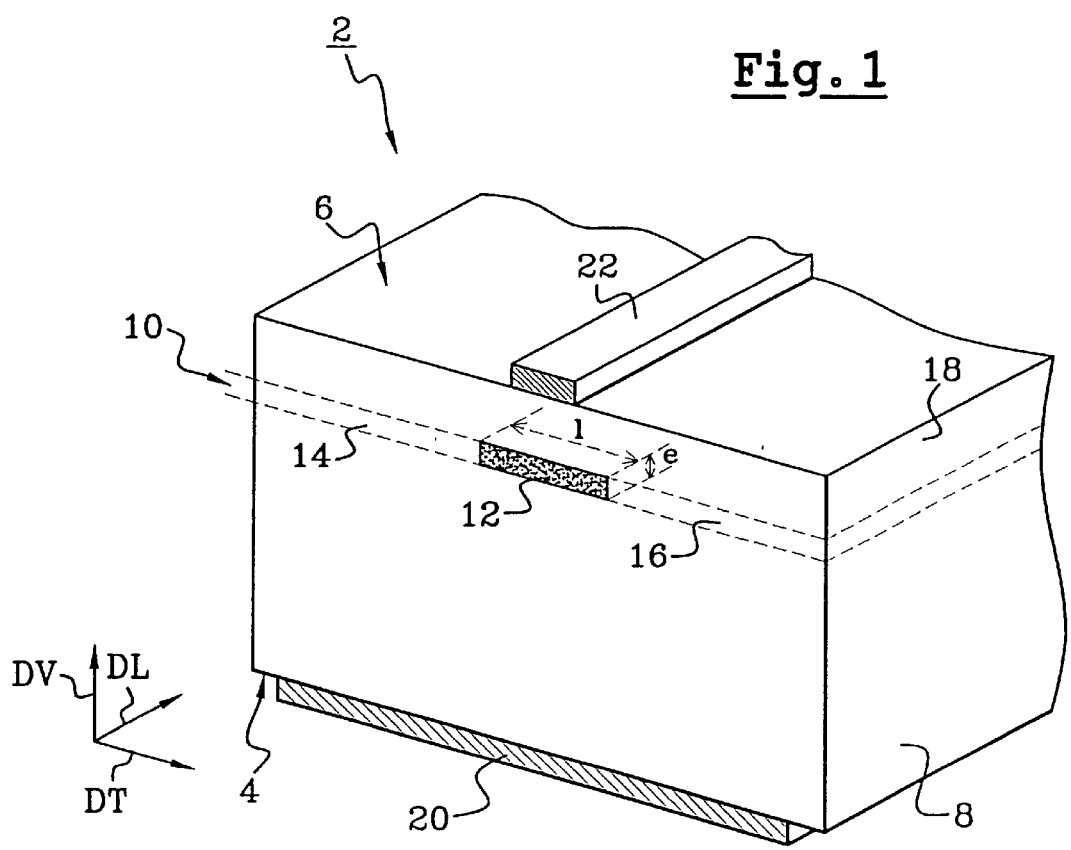

The invention provides a semiconductor optical amplifier whose gain is independent of the polarization of the light to be amplified.

The amplifier according to the invention has two amplifying sections 30 and 40 respectively favoring a higher gain of the TE mode and the TM mode of polarization of the light to be amplified, and each section 30 and 40 is controlled by a respective separate electrode 23 and 24.

Accordingly, by "active" adjustment, obtained by controlling the current injected into each electrode 23 and 24, it is possible to favor one or the other mode of polarization of the light to be amplified, to render the overall gain of the amplifier polarization-insensitive. The current applied must be sufficiently high to avoid problems due to noise, but without being too high, which would reduce the effects of electrical control of the polarization of the light.

According to one feature of the invention, the amplifier includes a single active guide structure 12 consisting of an etched and buried ridge. The ridge 12 is common to the sections 30 and 40 and has the same thickness everywhere.

The material of the active guide structure is preferably a quaternary material, for example InGaAsP.

The active guide structure 12 nevertheless has properties specific to each section 30 and 40 to favor a respective mode of polarization of the light to be amplified.

In a first embodiment, shown in FIG. 2, the active guide structure 12 has a different width $l_1$, $l_2$ in each section 30 and 40. The confinement factor of the wider ridge portion favors the TE propagation mode and the confinement factor of the narrower ridge portion favors the TM propagation mode.

This kind of ridge 12 is easy to produce by etching with a suitable mask that defines the respective widths of each section 30 and 40.

In various embodiments, the width $l_1$ of the active guide structure 12 of the section 30 favoring a higher gain of the TE mode is from 0.8 to 1.2 $\mu$m and the width $l_2$ of the active guide structure 12 of the section 40 favoring a higher gain of the TM mode is from 0.6 to 1.0 $\mu$m, with the condition $l_1 > l_2$ still met.

Unlike a difference in thickness, this difference in the width of the active ridge 12 ensures an adiabatic mode transition between the two sections 30 and 40, which eliminates the risk of reflection of light waves.

In a second embodiment, shown in FIG. 3, the active guide structure 12 has a curved portion 13 in the section 30 favoring the TE mode of propagation of the light to be amplified.

As previously, the material of the active guide structure and the confinement factor are the same in both sections 30 and 40. The curved section 13 of the ridge 12 favors the TE mode of propagation of light and the straight sections favor the TM mode (because of the nature of the material constituting the ridge). The straight ridge sections 40 are separated by the curved section 13 in the example shown, but are electrically connected by interconnected electrodes 24, 24'.

This kind of ridge 12 with a curved portion 13 is easily produced by etching with a suitable mask. Once again, an adiabatic mode transition is obtained between the two sections 30 and 40, which eliminates the risk of reflection of light waves.

In a third embodiment, shown in FIG. 4, the active guide structure 12 is subjected to respective different tension stresses in the sections 30 and 40.

The active guide structure 12 is made from a quaternary material. The tension stress difference between the two sections 30 and 40 is obtained by a difference between the stoichiometric ratios of the elements constituting the material of said active structure 12.

The use of the same material (InGaAsP) avoids an index step on passing from one section to the other and consequently reflection of light waves between the sections 30 and 40. It is the composition of the material that varies.

Accordingly, for a given wavelength $\lambda$ (for example 1.5 $\mu$m) of the light to be amplified, several pairs of values (x, y) are available for applying different lattice tensions to the $In_{1-x}Ga_xAs_{1-y}P_y$ material in each section.

The ridge 12 in each section is made by double epitaxial growth using the proven prior art butt-coupling technique.

The three embodiments described are not limiting on the present invention, and in particular can be combined with each other without departing from the scope of the invention.

What is claimed is:

1. A semiconductor optical amplifier including at least two amplifier sections (30, 40), a first section favoring a higher gain of the TE mode and a second section favoring a higher gain of the TM mode of polarization of the light to be amplified, said sections each having an active guide structure (12) constituted by a solid material and of identical thickness (e), the amplifier being characterized in that each section (30, 40) of the active guide structure (12) is subjected to different tension stresses so as to render the overall gain of the amplifier insensitive to the polarization of said light to be amplified, and in that there is no discontinuity of the effective refractive index at the transition between said sections (30, 40).

2. A semiconductor optical amplifier according to claim 1, characterized in that the active guide structure (12) of the sections (30, 40) is made from a material having different stoichiometric ratios between the elements constituting said material.

3. A semiconductor optical amplifier according to claim 1, characterized in that the material of the active guide structures (12) is a quaternary material.

4. A semiconductor optical amplifier according to claim 3, characterized in that the quaternary material is InGaAsP.

* * * * *